United States Patent
Tsai et al.

(10) Patent No.: US 8,539,392 B2
(45) Date of Patent: Sep. 17, 2013

(54) METHOD FOR COMPENSATING PROXIMITY EFFECTS OF PARTICLE BEAM LITHOGRAPHY PROCESSES

(75) Inventors: Kuen-Yu Tsai, Taipei (TW); Chun-Hung Liu, Taipei (TW); Philip C. W. Ng, Taipei (TW); Pei-Lin Tien, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/399,096

(22) Filed: Feb. 17, 2012

(65) Prior Publication Data

US 2012/0221983 A1    Aug. 30, 2012

Related U.S. Application Data

(60) Provisional application No. 61/446,077, filed on Feb. 24, 2011.

(30) Foreign Application Priority Data

Jul. 5, 2011    (TW) .............................. 100123715 A

(51) Int. Cl.
   *G06F 17/50*    (2006.01)
(52) U.S. Cl.
   USPC .......................................................... 716/53
(58) Field of Classification Search
   USPC .......................................................... 716/53
   See application file for complete search history.

(56) References Cited

U.S. PATENT DOCUMENTS

| | | |
|---|---|---|
| 3,943,281 A | 3/1976 | Keller et al. |
| 4,099,062 A | 7/1978 | Kitcher |
| 4,264,711 A | 4/1981 | Greeneich |
| 4,426,564 A | 1/1984 | Steigerwald et al. |
| 4,426,584 A | 1/1984 | Bohlen et al. |
| 4,498,010 A | 2/1985 | Biechler et al. |
| 4,504,558 A | 3/1985 | Bohlen et al. |
| 4,520,269 A | 5/1985 | Jones |
| 4,644,170 A | 2/1987 | Komatsu |
| 4,801,843 A | 1/1989 | Mensies |
| 4,823,046 A | 4/1989 | Sluyterman |
| 4,943,729 A | 7/1990 | Ando et al. |
| 5,051,598 A | 9/1991 | Ashton et al. |
| 5,086,398 A | 2/1992 | Moriizumi |
| 5,182,718 A | 1/1993 | Harafuji et al. |

(Continued)

OTHER PUBLICATIONS

Mihir Parikh, "Self-consistent proximity effect correction technique for resist Exposure (SPECTRE)", J. Vac. Sci. Technol., vol. 15, No. 3, pp. 931-933, May/Jun. 1978.

(Continued)

*Primary Examiner* — Vuthe Siek
(74) *Attorney, Agent, or Firm* — Rabin & Berdo, P.C.

(57) ABSTRACT

A method for compensating proximity effects of particle beam lithography processes is provided. The method includes the following steps. A control pattern is provided. A dissection process is provided. A set of control points are provided. The control pattern is defined as an input pattern of a lithography process. A target pattern is provided. A set of target points are produced. A set of target measurement values are provided. An actual pattern is defined. A set of actual measurement values are provided. A set of comparison values are calculated. An adjusting strategy is provided. A corrected pattern is produced. The corrected pattern is defined as an updated input of the lithography process.

13 Claims, 3 Drawing Sheets

(56) References Cited

U.S. PATENT DOCUMENTS

| | | | |
|---|---|---|---|
| 5,241,185 A | 8/1993 | Meiri et al. |
| 5,250,812 A | 10/1993 | Murai et al. |
| 5,251,140 A | 10/1993 | Chung et al. |
| 5,334,282 A | 8/1994 | Nakayama et al. |
| 5,424,173 A | 6/1995 | Wakabayashi et al. |
| 5,432,714 A | 7/1995 | Chung et al. |
| 5,553,273 A | 9/1996 | Liebmann |
| 5,682,323 A | 10/1997 | Pasch et al. |
| 5,723,233 A | 3/1998 | Garza et al. |
| 5,827,623 A | 10/1998 | Ishida et al. |
| 5,841,145 A | 11/1998 | Satoh et al. |
| 5,933,212 A | 8/1999 | Kasuga |
| 6,057,066 A | 5/2000 | Hanawa |
| 6,064,485 A | 5/2000 | Lin et al. |
| 6,071,658 A | 6/2000 | Wu et al. |
| 6,087,046 A | 7/2000 | Nakasuji |
| 6,146,103 A | 11/2000 | Lee et al. |
| 6,174,801 B1 | 1/2001 | Tzu et al. |
| 6,194,104 B1 | 2/2001 | Hsu |
| 6,218,089 B1 | 4/2001 | Pierrat |
| 6,221,260 B1 | 4/2001 | Chahine et al. |
| 6,281,513 B1 | 8/2001 | Takenaka |
| 6,316,164 B1 | 11/2001 | Parker et al. |
| 6,355,383 B1 | 3/2002 | Yamashita |
| 6,539,521 B1 | 3/2003 | Pierrat et al. |
| 6,541,784 B1 | 4/2003 | Kawano et al. |
| 6,597,001 B1 | 7/2003 | Yamashita et al |
| 6,720,565 B2 | 4/2004 | Innes et al. |
| 6,821,479 B1 | 11/2004 | Smith et al. |
| 6,828,573 B1 | 12/2004 | Kawano et al. |
| 6,835,937 B1 | 12/2004 | Muraki et al. |
| 6,872,507 B2 | 3/2005 | Tzu et al. |
| 6,972,417 B2 | 12/2005 | Suganuma et al. |
| 7,065,735 B2 | 6/2006 | Ki et al. |
| 7,112,417 B2 | 9/2006 | Vyakarnam et al. |
| 7,120,285 B1 | 10/2006 | Spence |
| 7,241,542 B2 | 7/2007 | Hudek et al. |
| 7,260,812 B2 | 8/2007 | Melvin, III et al. |
| 7,462,848 B2 | 12/2008 | Parker |
| 7,525,110 B2 | 4/2009 | Suzuki et al. |
| 7,598,005 B2 | 10/2009 | Yamamoto |
| 7,635,851 B2 | 12/2009 | Fujita et al. |
| 7,786,454 B2 | 8/2010 | Parker |
| 2007/0028206 A1* | 2/2007 | Chou et al. ............ 716/21 |

OTHER PUBLICATIONS

K. D. Cummings et al., "Using a neural network to proximity correct patterns written with a Cambridge electron beam microfabricator 1 0.5 lithography system", Appl. Phys., Lett. vol. 57, No. 14, pp. 1431-1433, Oct. 1, 1990.

Y. C. Pati et al., "An error measure for dose correction in e-beam nanolithography", J. Vac. Sci. Technol. B, vol. 8, No. 6, pp. 1882-1888, Nov./Dec. 1990.

M. Hintermaler et al., "Proximity correction using computer aided proximity correction (CAPROX):Evaluation and application", J. Vac. Sci. Technol. B, vol. 9, No. 6, pp. 3044-3047, Nov./Dec. 1991.

Kenji Harafuji et al., "Proximity effect correction data processing system for electron beam lithography", J. Vac. Sci. Technol. B, vol. 10, No. 1, pp. 133-142, Jan./Feb. 1992.

Chih-Yuan Chang et al., "A computational method for the correction of proximity effect in electron-beam lithography", SPIE, vol. 1671, pp. 208-214, Mar. 8, 1992.

Hans Eisenmann et al., "PROXECCO—Proximity effect correction by convolution", J. Vac. Sci. Technol. B, vol. 11, No. 6, pp. 2741-2745, Nov./Dec. 1993.

Wu, Mei-Jen, "The Study on the Determination of Proximity Parameters and Proximity Effect Correction in Electron Beam Lithography", pp. 1-78, 1997.

Brian D. Cook et al., "Dose, shape, and hybrid modifications for PYRAMID in electron beam proximity effect correction", J. Vac. Sci. Technol. B, vol. 15, No. 6, pp. 2303-2308, Nov./Dec. 1997.

Brian D. Cook et al., "PYRAMID—A Hierarchical, Rule-Based Approach Toward Proximity Effect Correction—Part II: Correction", IEEE Transactions on Semiconductor Manufacturing, vol. 11, No. 1, pp. 117-128, Feb. 1998.

Teruaki Okino et al., "Investigation of proximity effect correction in electron projection lithography (EPL)", Proceedings of SPIE, vol. 3997, pp. 235-244, Feb. 28, 2000.

Soo-Young Lee et al., "Automatic determination of spatial dose distribution for improved accuracy in e-beam proximity effect correction", Microelectronic Engineering, vol. 57-58, pp. 303-309, Sep. 2001.

Soon Ho Kim et al., "Mask process proximity correction for next-generation mask fabrication", J. Vac. Sci. Technol. B , vol. 21, No. 6, pp. 3041-3045, Nov./Dec. 2003.

S.-Y. Lee et al., "Simultaneous dose modification for balanced E-beam proximity correction minimizing CD error", Microelectronic Engineering, vol. 69, pp. 47-56, Aug. 2003.

Jan-Tsai Liu, "E-Beam Proximity Effect Correction and Its Application to the Fabrication of SOI FinFET",Degree Program of Electrical Engineering Computer Science, National Chiao Tung University, pp. 1-72, 2003.

Noppachai Anupongpaibool et al., "Distributed Correction of Proximity Effect in Electron Beam Lithography on a Heterogeneous Cluster", Proceedings of the 18th International Parallel and Distributed Processing Symposium (IPDPS'04), Apr. 2004.

Sheng-Jung Hung, "Electron-beam Lithography Proximity Effect Correction and Fabrication of Anti-reflection Coating with BA-m Benzoxazine film", Institute of Chemical and Materials Engineering, National Central University, pp. 1-108, Jul. 17, 2006.

S. Manakli et al., "New Electron Beam Proximity Effects Correction Approach for 45 and 32nm Nodes", Jpn. J. Appl. Phys., vol. 45, No. 8A, pp. 6462-6467, Aug. 4, 2006.

Serdar Manakli et al., "Complementary dose and geometrical solutions for electron beam direct write lithography proximity effects correction: application for sub-45-nm node product manufacturing", J. Micro/Nanolith. MEMS MOEMS, vol. 6, No. 3, pp. 033001-1-033001-7, Jul.-Sep. 2007.

Soo-Young Lee, "Pyramid:A Hierarchical Approach to E-beam Proximity Effect Correction", Electrical and Computer Engineering, Auburn University, pp. 1-42, Feb. 1998.

Pei-Lin Tien, "Design of Model-based Identification and Correction Algorithms for Electron Proximity Effects", Graduate Institute of Electrical Engineering College of Electrical Engineering and Computer Science, National Taiwan University, pp. 1-42, Jul. 2007.

Yi-Sheng Su et al., "Design of Automatic Controllers for Model-based OPC with Optimal Resist Threshold Determination for Improving Correction Convergence", Proc. of SPIE, vol. 6924, pp. 69243Z-1-69243Z-9, Feb. 2008.

Chun-Hung Liu et al., "Model-Based Proximity Effect Correction for Electron-Beam-Direct- Write Lithography", Proc. of SPIE, vol. 7637, pp. 76371V-1-76371V-8, Feb. 23, 2010.

Geraint Owen and Paul Rissman, "Proximity effect correction for electron beam lithography by equalization of background dose", J. Appl. Phys., vol. 54, No. 6, pp. 3573-3581, Jun. 1983.

Chris Cork et al., "Optical proximity correction challenges with highly elliptical contacts." Proc. of SPIE, vol. 7823, pp. 78233R-1-78233R-11, Sep. 13, 2010.

* cited by examiner

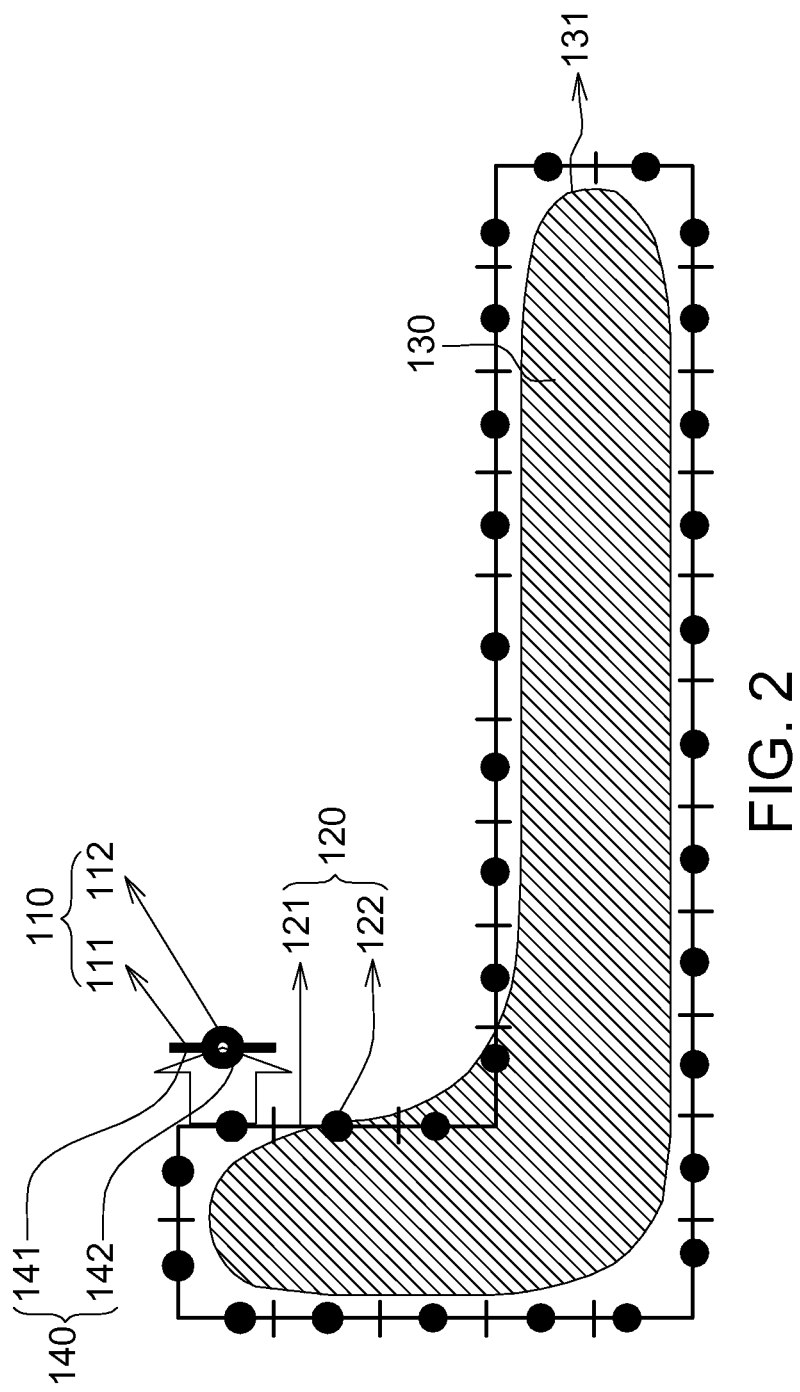

METHOD FOR COMPENSATING PROXIMITY EFFECTS OF PARTICLE BEAM LITHOGRAPHY PROCESSES

This application claims the benefits of a provisional application Ser. No. 61/446,077, filed Feb. 24, 2011, and Taiwan application Serial No. 100123715, filed Jul. 5, 2011, the subject matters of which are incorporated herein by reference.

BACKGROUND OF THE INVENTION

1. Field of the Invention

The invention relates in general to a method for compensating proximity effects of lithography processes, and more particularly to a method for compensating proximity effects of particle beam lithography processes.

2. Description of the Related Art

Lithography technology, which plays a very important role in the semiconductor manufacturing process, must be conformed to new generation circuit design rules otherwise the development in the semiconductor industry will be hindered. In recent years, the integrated circuit design rules are directed towards miniaturization. Therefore, lithography technology, which is crucial to the effectiveness of patterning fidelity, must take the trend of miniaturization into consideration and require tremendous efforts in terms of labor, resources, capital and time in the development of exposing equipment, the establishment of manufacturing processes, the fabrication of masks and the application of relevant technologies.

The conventional lithography system mainly includes an item of optical lithography equipment. In terms of a deep ultra violet (DUV) light source, the resolution has much to do with the wavelength of the light source, and has a limit. Therefore, the development of lithography technology is gradually directed towards the electron beam, X-ray, extreme ultra violet (EUV) light, ion beam and so on.

The electron beam lithography technology is based on the concept of a scanning election microscope (SEM). The wavelength of the electron beam of the lithography technology is only several thousandth of the deep ultra violet light, hence producing excellent resolution. In order to make for the inadequacy in the resolution of an optical lithography system, electron beam lithography technology is also used in the direct writing of a wafer for directly printing the pattern on a photosensitive material disposed on a wafer surface.

SUMMARY OF THE INVENTION

The invention is directed to a method for compensating proximity effects of particle beam lithography processes. The method is performed by several recursive adjusting means, such that the difference between an actual pattern and a target pattern can be fitted in with a target value range.

According to a first aspect of the present invention, a method for compensating proximity effects of particle beam lithography processes is provided. The method comprises (a) providing a control pattern consisted of a set of control boundaries; (b) providing a dissection process, wherein the dissection process produces a set of points according to an import pattern which is composed of a set of boundaries, and the set of the boundaries pass through the set of the points; (c) providing a set of control points produced according to the dissection process and the control pattern, wherein the set of the control boundaries pass through the set of the control points; (d) defining the control pattern as being an input pattern of the lithography process; (e) providing a target pattern consisted of a set of target boundaries; (f) providing a set of target points produced according to the dissection process and the target pattern, the set of the target boundaries passing through the set of the target points; (g) providing a set of target measurement values, wherein the set of the target measurement values are obtained from the set of the target points and the set of the target boundaries; (h) defining an actual pattern consisted of a set of actual boundaries; (i) providing a set of actual measurement values, wherein the actual measurement values are obtained from the set of the target points and the set of the actual boundaries; (j) calculating a set of comparison values according to the set of the target measurement values and the set of the actual measurement values; (k) providing an adjusting strategy; (l) producing a corrected pattern according to the set of the comparison values and the adjusting strategy, the corrected pattern consisted of a set of corrected boundaries and the set of the corrected boundaries passing through the set of the control points; and (m) defining the corrected pattern as an updated input pattern of the lithography process according to the set of the corrected boundaries.

The invention will become apparent from the following detailed description of the preferred but non-limiting embodiments. The following description is made with reference to the accompanying drawings.

BRIEF DESCRIPTION OF THE DRAWINGS

FIG. 2 illustrates FIGS. 1A-1B.

DETAILED DESCRIPTION OF THE INVENTION

An embodiment is disclosed below for elaborating the invention. However, the embodiment is for exemplification purpose only, not for limiting the scope of protection of the invention. Also, secondary elements are omitted in the embodiment for highlighting the technical features of the invention.

Figure 1A:
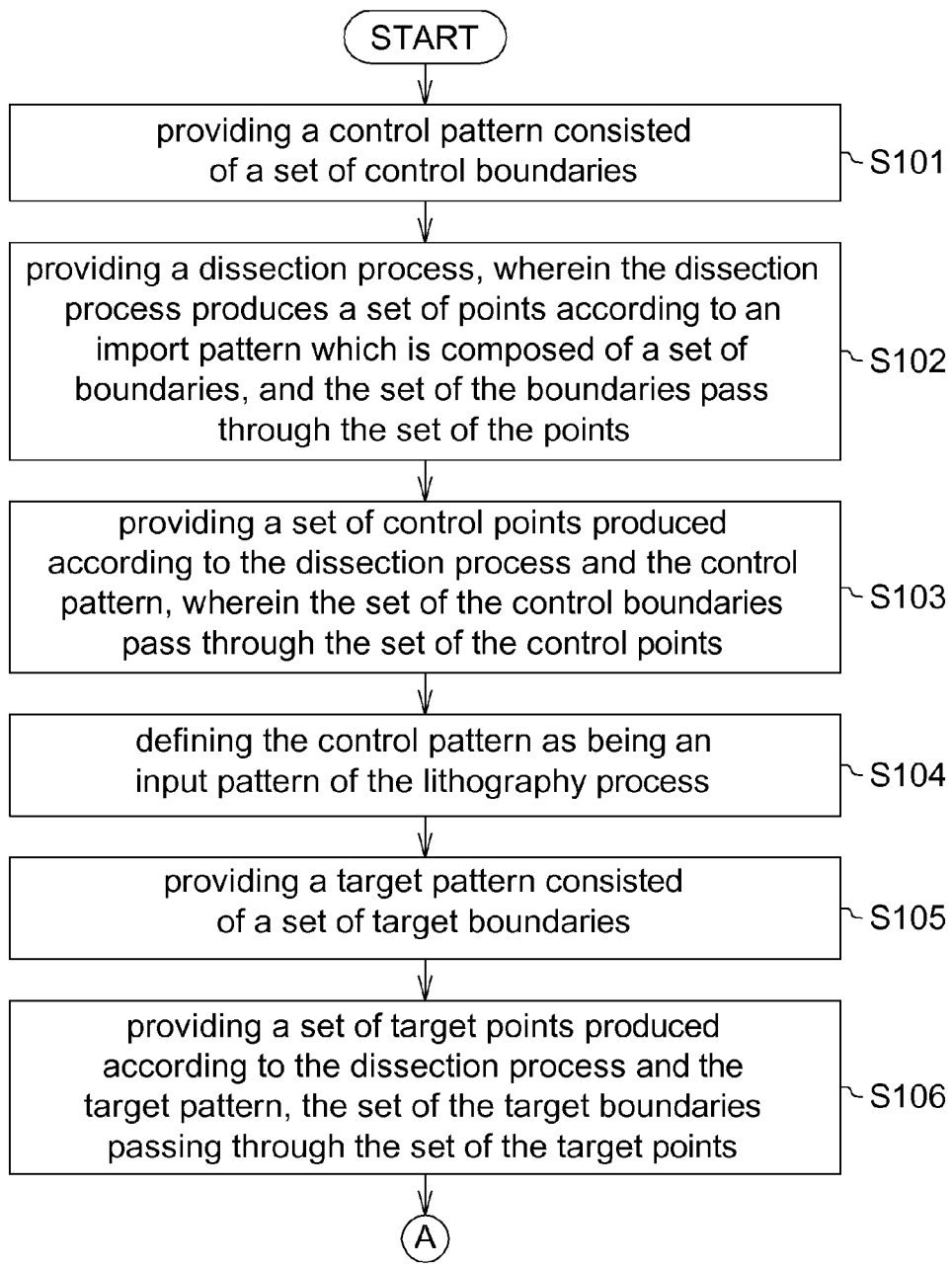
FIGS. 1A-1B show a flowchart of a method for compensating proximity effects of particle beam lithography processes according to a preferred embodiment of the invention.
Figure 1B:
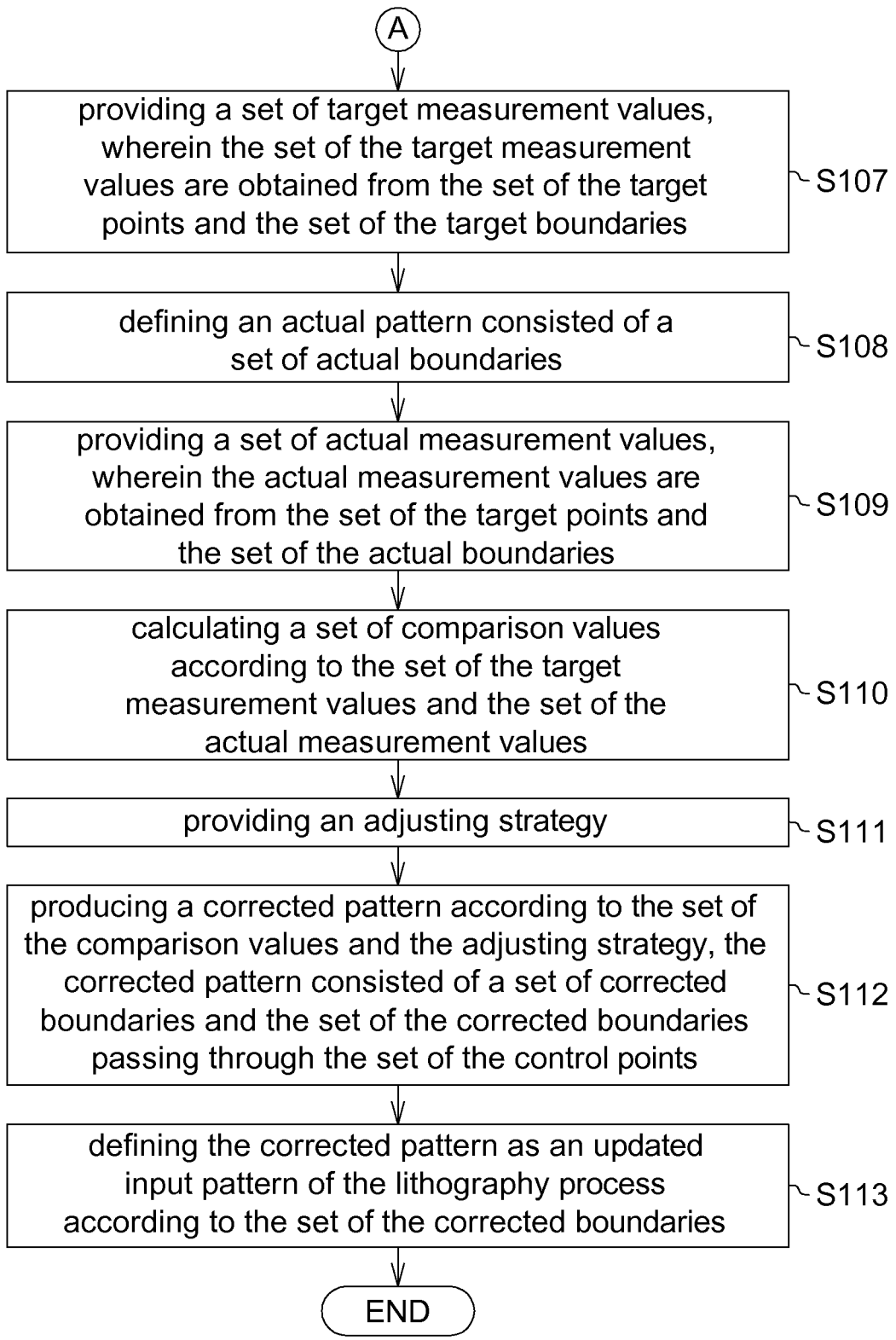

Please refer to FIGS. 1A-1B and 2 at the same time. FIGS. 1A-1B show a flowchart of a method for compensating a proximity effect of a particle beam lithography process according to a preferred embodiment of the invention. FIG. 2 illustrates FIGS. 1A-1B. In the present embodiment, the particle beam can be an ion beam, an electron beam or a neutron beam.

Further, the proximity effect is resulted from an accumulative energy or a scattering of particles in a resist layer, and the proximity effect results in the difference between a target pattern and an actual pattern.

Firstly, in step S101, a control pattern 110 is provided. The control pattern 110 is consisted of a set of control boundaries 111. As shown in FIG. 2, each of the set of the control boundaries 111 encloses a region with a constant energy distribution respectively.

Next, in step S102, a dissection process is provided. The dissection process produces a set of points according to an import pattern which is composed of a set of boundaries, and the set of the boundaries pass through the set of the points.

Afterwards, in step S103, a set of control points 112 is provided. The control points 112 are produced according to the dissection process and the control pattern 110. As shown in FIG. 2, the set of the control boundaries 111 pass through the set of the control points 112.

Then, in step S104, the control pattern 110 is defined as being an input pattern of the lithography process.

Next, in step S105, a target pattern 120 is provided. As shown in FIG. 2, the target pattern 120 is consisted of a set of target boundaries 121.

In addition, the set of the target boundaries 121 represent a target energy distribution or a set of target resist contours.

Afterwards, in step S106, a set of target points 122 are produced according to the dissection process and the target pattern 120. The set of the target boundaries 121 pass through the set of the target points 122.

Next, in step 107, a set of target measurement values are provided. The set of the target measurement values are obtained from the set of the target points 122 and the set of the target boundaries 121.

Next, in step 108, an actual pattern 130 is defined. The actual pattern 130 is consisted of a set of actual boundaries 131.

In addition, the actual pattern 130 is obtained by processing a lithography process from the input pattern, i.e. the control pattern 110.

Furthermore, the actual pattern 130 can be also obtained via a numerical simulating process from the input pattern, i.e. the control pattern 110. The numerical simulating process includes a numerical model, and the numerical model is used for predicting the actual boundaries 131 in the lithography process.

Moreover, the actual boundaries 131 represent a set of actual energy distributions or a set of actual resist contours.

Afterwards, in step S109, a set of actual measurement values are obtained from the set of the target points 122 and the set of the actual boundaries 131.

Next, in step S110, a set of comparison values are calculated according to the set of the target measurement values and the set of the actual measurement values.

Afterwards, in step S111, an adjusting strategy is provided.

Then, in step S112, a corrected pattern 140 is produced according to the set of the comparison values and the adjusting strategy. As shown in FIG. 2, the corrected pattern 140 is consisted of a set of corrected boundaries 141. The set of the corrected boundaries 141 pass through the set of the control points 142.

Afterwards, in step S113, the corrected pattern 140 is defined as an updated input pattern of the lithography process according to the set of the corrected boundaries 141.

In the present method, a target value range or a maximum recursive number is defined. If the comparison values do not reach the target value range, then the adjusting strategy is performed. Then, whether the comparison values reach the target value range or not is determined again until the comparison values reach the target value range or the recursive number reaches the maximum recursive number.

The present embodiment is used to adjust the proximity effect of the particle beam lithography process by several recursive steps, such that the precision of the particle beam lithography process can be improved greatly. It is an extreme progress for the semiconductor lithography process.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for compensating a proximity effect of a particle beam lithography process, comprising:

(a) providing a control pattern consisted of a set of control boundaries;

(b) providing a dissection process, wherein the dissection process produces a set of dissection points according to an import pattern which is composed of a set of import boundaries, the set of the import boundaries passing through the set of the dissection points;

(c) providing a set of control points produced according to the dissection process and the control pattern, the set of the control boundaries passing through the set of control points;

(d) defining the control pattern as an input pattern of the lithography process;

(e) providing a target pattern consisting of a set of target boundaries;

(f) providing a set of target points produced according to the dissection process and the target pattern, the set of target boundaries passing through the set of the target points;

(g) providing a set of target measurement values, wherein the set of the target measurement values are obtained from the set of target points and the set of target boundaries;

(h) defining an actual pattern consisting of a set of actual boundaries;

(i) providing a set of actual measurement values, wherein the actual measurement values are obtained from the set of the target points and the set of the actual boundaries;

(j) calculating a set of comparison values according to the set of target measurement values and the set of actual measurement values by a computer;

(k) providing an adjusting strategy;

(l) producing a corrected pattern according to the set of comparison values and the adjusting strategy, the corrected pattern consisting of a set of corrected boundaries and the set of corrected boundaries passing through the set of control points; and (m) defining the corrected pattern as an updated input pattern of the lithography process according to the set of corrected boundaries.

2. The method for compensating the proximity effect of the particle beam lithography process according to claim 1, wherein the proximity effect results from an accumulative energy or a scattering of particles in a resist layer, and results in the difference between the target pattern and the actual pattern.

3. The method for compensating the proximity effect of the particle beam lithography process according to claim 1, wherein each of the control boundaries of the set of control boundaries encloses a respective region with a constant energy distribution.

4. The method for compensating the proximity effect of the particle beam lithography process according to claim 1, wherein the set of target boundaries represent a set of target energy distributions or a set of target resist contours.

5. The method for compensating the proximity effect of the particle beam lithography process according to claim 1, wherein the set of actual boundaries represents a set of actual energy distributions or a set of actual resist contour.

6. The method for compensating the proximity effect of the particle beam lithography process according to claim 1, wherein the actual pattern is obtained by processing a lithography process from the input pattern.

7. The method for compensating the proximity effect of the particle beam lithography process according to claim 1, wherein the actual pattern is obtained via a numerical simulating process from the input pattern, the numerical simulating process includes a numerical model, and the numerical model is used for predicting the actual boundaries in the lithography process.

8. The method for compensating the proximity effect of the particle beam lithography process according to claim 1, further comprising:
   defining a target value range or a maximum recursive number;
   wherein if the comparison values do not reach the target value range, then the adjusting strategy is performed and then whether the comparison values reach the target value range is determined again until the comparison values reach the target value range or the recursive number reaches the maximum recursive number.

9. The method for compensating the proximity effect of the particle beam lithography process according to claim 1, wherein the adjusting strategy is used for adjusting one of the control points.

10. The method for compensating the proximity effect of the particle beam lithography process according to claim 1, wherein the adjusting strategy is used for adjusting more than one of the control points.

11. The method for compensating the proximity effect of the particle beam lithography process according to claim 1, wherein the particle beam is an ion beam.

12. The method for compensating the proximity effect of the particle beam lithography process according to claim 1, wherein the particle beam is an electron beam.

13. The method for compensating the proximity effect of the particle beam lithography process according to claim 1, wherein the particle beam is a neutron beam.

* * * * *